(12) United States Patent
Nigen et al.

(10) Patent No.: US 9,408,328 B2
(45) Date of Patent: Aug. 2, 2016

(54) SOLID-STATE DRIVE WITH PASSIVE HEAT TRANSFER

(71) Applicant: Apple Inc., Cupertino, CA (US)

(72) Inventors: Jay S. Nigen, Mountain View, CA (US);
Ron A. Hopkinson, Campbell, CA (US);
Derek J. Yap, San Carlos, CA (US);
Eric A. Knopf, Mountain View, CA (US); William F. Leggett, Cupertino, CA (US); Richard H. Tan, Fremont, CA (US)

(73) Assignee: Apple Inc., Cupertino, CA (US)

( * ) Notice: Subject to any disclaimer, the term of this patent is extended or adjusted under 35 U.S.C. 154(b) by 356 days.

(21) Appl. No.: 13/683,955

(22) Filed: Nov. 21, 2012

(65) Prior Publication Data

US 2013/0329352 A1    Dec. 12, 2013

Related U.S. Application Data

(60) Provisional application No. 61/656,747, filed on Jun. 7, 2012, provisional application No. 61/657,489, filed on Jun. 8, 2012.

(51) Int. Cl.
*H05K 7/20* (2006.01)
*F28F 21/00* (2006.01)
(Continued)

(52) U.S. Cl.
CPC ............... *H05K 7/205* (2013.01); *F28F 21/00* (2013.01); *G06F 1/20* (2013.01); *H01L 23/3737* (2013.01);
(Continued)

(58) Field of Classification Search
CPC ..................................................... H05K 7/205
USPC .................................................... 174/50.61
See application file for complete search history.

(56) References Cited

U.S. PATENT DOCUMENTS 7,518,862 B1 * 4/2009 Macika ..................... G06F 1/20
361/688
8,067,784 B2 * 11/2011 Lin ..................... H05K 1/0204
257/712

(Continued)

FOREIGN PATENT DOCUMENTS

CN        101035411 A     9/2007
CN       1011188904 A     5/2008

(Continued)

OTHER PUBLICATIONS

Chinese Application for Invention No. 201310222556.0—First Office Action dated Jan. 5, 2016.

*Primary Examiner* — Jenny L Wagner
*Assistant Examiner* — Michael P McFadden
(74) *Attorney, Agent, or Firm* — Downey Brand LLP

(57) ABSTRACT

The disclosed embodiments relate to a system that facilitates thermal conductance in a system that includes a module comprising a circuit board with integrated circuits, such as a solid-state drive. A thermal-coupling material between one side of the circuit board and an adjacent baseplate is used to increase thermal conduction between the circuit board and the baseplate. Furthermore, the module may include another thermal-coupling material between the baseplate and a housing that at least in part surrounds the circuit board, thereby increasing thermal conduction between the baseplate and the housing. In these ways, the baseplate and/or the housing may be used as a heat-transfer surfaces or heat spreaders that reduce hotspots associated with operation of the integrated circuits.

40 Claims, 6 Drawing Sheets

(51) Int. Cl.
  *G06F 1/20* (2006.01)
  *H05K 1/02* (2006.01)
  *H01L 23/373* (2006.01)
  *H05K 1/14* (2006.01)
  *H05K 3/00* (2006.01)

(52) U.S. Cl.
  CPC .......... *H05K 1/0201* (2013.01); *H05K 7/20436* (2013.01); *H01L 2924/0002* (2013.01); *H05K 1/141* (2013.01); *H05K 3/0061* (2013.01); *H05K 2201/042* (2013.01); *H05K 2201/10159* (2013.01)

(56) References Cited

U.S. PATENT DOCUMENTS

| | | | |
|---|---|---|---|
| 2003/0161603 A1* | 8/2003 | Nadeau et al. | 385/137 |
| 2006/0133042 A1* | 6/2006 | Belady | G06F 1/189 361/704 |
| 2006/0198108 A1* | 9/2006 | Refai-Ahmed | H05K 1/0203 361/719 |
| 2007/0230115 A1 | 10/2007 | Dobritz et al. | |
| 2008/0123312 A1* | 5/2008 | Cheng et al. | 361/790 |
| 2010/0187670 A1* | 7/2010 | Lin et al. | 257/686 |
| 2010/0315787 A1* | 12/2010 | Li | H01L 23/3677 361/709 |
| 2011/0255850 A1* | 10/2011 | Dinh et al. | 396/176 |
| 2014/0158409 A1 | 6/2014 | Sung | |

FOREIGN PATENT DOCUMENTS

| | | |
|---|---|---|
| CN | 201700077 U | 1/2011 |
| CN | 201774736 U | 3/2011 |
| CN | 102134469 A | 7/2011 |
| CN | 202026562 U | 11/2011 |

\* cited by examiner

SOLID-STATE DRIVE WITH PASSIVE HEAT TRANSFER

CROSS REFERENCE TO RELATED APPLICATIONS

This application claims priority under 35 U.S.C. §119(e) to U.S. Provisional Application Ser. No. 61/656,747, entitled "Solid-State Drive with Passive Heat Transfer," by Jay S. Nigen, Ron A. Hopkinson Derek J. Yap, and Eric A. Knopf, filed on Jun. 7, 2012; and to U.S. Provisional Application Ser. No. 61/657,489, entitled "Thermal Coupling to a Wireless Communication Circuit Board," by William F. Leggett, Richard H. Tan and Jay S. Nigen, filed on Jun. 8, 2012, the contents of both of which are herein incorporated by reference.

BACKGROUND

1. Field

The described embodiments relate to techniques for cooling integrated circuits.

2. Related Art

A solid-state drive is a type of memory that stores information on multiple integrated circuits. For example, the integrated circuits may include a solid-state non-volatile memory, such as flash memory chips or dynamic-random-access-memory (DRAM) chips. Solid-state drives are increasingly popular because, unlike hard-disk drives, they do not contain moving parts, and are therefore more reliable, have reduced power consumption and generate less noise.

However, flash memory chips, such as NAND flash devices, are susceptible to memory wear after repeated program-erase cycles. In particular, stored information can be lost if a specified maximum number of program-erase cycles (such as 1,000,000 program-erase cycles) is exceeded. This memory wear can be exacerbated by the temperature increase associated with the heat generated during operation of a flash memory chip.

More expensive, solid-state drives based on DRAM chips offer reduced latency and are not susceptible to memory wear. However, DRAM chips also generate heat during operation. The temperature increase associated with this heat can adversely impact other components in electronic devices that include solid-state drives.

More generally, the computational performance of integrated circuits has increased significantly in recent years. This increased performance has been accompanied by an increase in power consumption and associated heat generation. Furthermore, this additional heat generation has made it harder to maintain acceptable operational temperatures in these integrated circuits.

Cooling integrated circuits that include wireless-communication circuits (which are sometimes referred to as 'wireless-communication integrated circuits') can be especially challenging. This is because these integrated circuits are often enclosed in electromagnetic-interference shields to reduce interference.

Existing approaches to cooling a wireless-communication integrated circuit often use an electromagnetic-interference shield as a heat sink. Thus, a thermal-interface material is often included between electromagnetic-interference shield and wireless-communication integrated circuit to increase the thermal conductance between them. However, there are limits to the thermal power that can be conducted away from wireless-communication integrated circuits via this thermal path, which can constrain the performance of wireless-communication integrated circuits.

SUMMARY

Some of the described embodiments facilitate thermal conductance in a system that includes a module with a circuit board, having a top surface and a bottom surface, and integrated circuits disposed on the top surface and the bottom surface. Moreover, the module includes a baseplate, having a top surface and a bottom surface, mechanically coupled to an edge of the circuit board. Furthermore, a first thermal-coupling material is mechanically coupled to the bottom surface of the circuit board and the top surface of the baseplate. This first thermal-coupling material increases a thermal conductance between the circuit board and the baseplate.

Note that the integrated circuits may include memory, such as flash memory.

Additionally, the first thermal-coupling material may include a thermal pad and/or a thermal gel.

In some embodiments, the module includes a housing enclosing the circuit board, the baseplate and the first thermal-coupling material. Moreover, the module may include a second thermal-coupling material mechanically coupled to the bottom surface of the baseplate. This second thermal-coupling material may include a thermal pad. Additionally, the housing may enclose the circuit board, the baseplate, the first thermal-coupling material and the second thermal-coupling material.

Furthermore, the baseplate may be made of metal.

Another embodiment provides a portable electronic device. This portable electronic device may include an external housing and the module. In the portable electronic device, the second thermal material may be mechanically coupled to the bottom surface of the baseplate and the external housing, and may increase a thermal conductance between the baseplate and the external housing.

Another embodiment provides a method for transferring heat from integrated circuits. During the method, heat is transferred from the integrated circuits disposed on surfaces of a circuit board to the baseplate mechanically coupled to the edge of the circuit board using the first thermal-coupling material disposed between the circuit board and the baseplate, where the first thermal-coupling material increases the thermal conductance between the circuit board and the baseplate. Then, heat is transferred from the baseplate to the external housing of the portable electronic device that includes the circuit board, the integrated circuits and the baseplate using the second thermal-coupling material disposed between the baseplate and the external housing, where the second thermal-coupling material increases the thermal conductance between the baseplate and the external housing.

Additional described embodiments facilitate thermal conductance in a second module with a circuit board, having a top surface and a bottom surface, and an integrated circuit disposed on the top surface. Moreover, the second module includes a second circuit board, having a top surface, mechanically coupled to the circuit board. Furthermore, the bottom surface of the circuit board is separated from the top surface of the second circuit board by a gap, and a thermal-interface material in the gap between the bottom surface of the circuit board and the top surface of the second circuit board thermally couples the circuit board and the second circuit board so that heat generated during operation of the integrated circuit is conducted to the second circuit board.

In some embodiments, the second module includes an electromagnetic-interference shield disposed on the top surface of the circuit board and at least partially enclosing the integrated circuit. For example, the circuit board may include a wireless-communication circuit board.

Alternatively, the integrated circuit may include a solid-state memory. For example, the circuit board may include a solid-state drive.

Note that the thermal-interface material may include: a foam, a thermal gel, a thermal pad, thermal grease, and/or an elastomeric material.

In some embodiments, the second module includes components disposed on the bottom surface of the circuit board, where a surface of the thermal-interface material facing the bottom surface of the circuit board includes pre-compressed regions so that a contact area between the surface of the thermal-interface material and the bottom surface of the circuit board is increased relative to a thermal-interface material without the pre-compressed regions.

Another embodiment provides a second portable electronic device that includes the second module.

Another embodiment provides a second method for transferring heat from an integrated circuit. During the second method, heat generated by the integrated circuit disposed on the top surface of the circuit board is transferred to the bottom surface of the circuit board. Then, the heat is conducted to a top surface of the second circuit board, which is thermally coupled to the circuit board by the thermal-interface material. Note that the bottom surface of the circuit board is separated from the top surface of the second circuit board by the gap, and the thermal-interface material is in the gap between the bottom surface of the circuit board and the top surface of the second circuit board.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Figure 1:
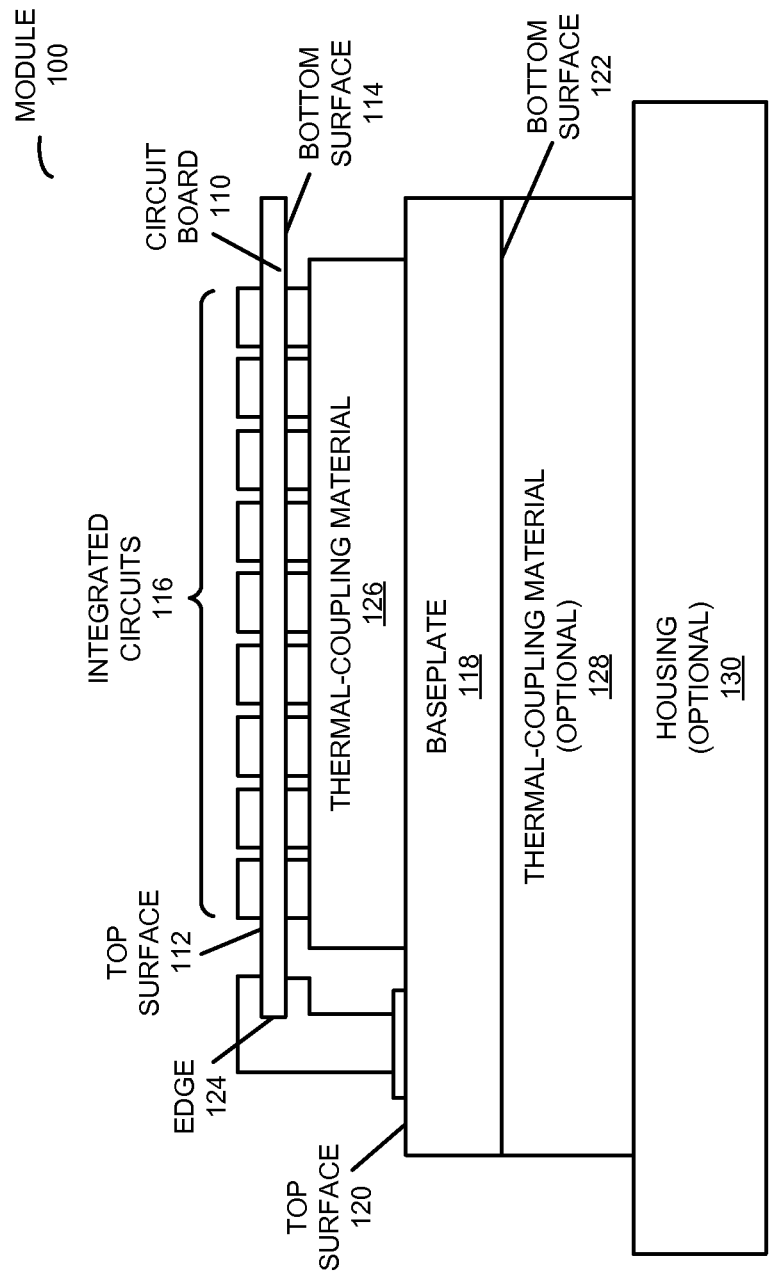
FIG. 1 is a block diagram illustrating a side view of a module in accordance with an embodiment of the present disclosure.

FIG. 1 presents a block diagram illustrating a side view of a module 100. This module includes a circuit board 110, having a top surface 112 and a bottom surface 114, and integrated circuits 116 disposed on top surface 112 and bottom surface 114. For example, integrated circuits 116 may include memory, such as flash memory or dynamic-random-access memory (DRAM). Therefore, module 100 may include a solid-state drive. More generally, module 100 may include another type of volatile or non-volatile computer-readable memory.

Moreover, module 100 includes a baseplate 118, having a top surface 120 and a bottom surface 122, mechanically coupled to an edge 124 of circuit board 110. For example, baseplate 118 may be made of metal. Furthermore, a thermal-coupling material 126 is mechanically coupled to bottom surface 114 and top surface 120. This thermal-coupling material may increase a thermal conductance (defined as $\kappa \cdot A/L$, where $\kappa$ is the thermal conductivity of thermal-coupling material 126, A is a cross-sectional area, and L is a thickness) between circuit board 110 and baseplate 118 so that baseplate 118 can be used as a heat-transfer surface or heat spreader for integrated circuits 116. For example, thermal-coupling material 126 may include a thermal pad and/or a thermal gel. In an exemplary embodiment, the thermal gel is Gel 30 (from Chomerics North America of Woburn, Mass.) and/or the thermal pad is the Gap Pad VO Ultra Soft (from The Bergquist Company of Chanhassen, Minn.).

In some embodiments, module 100 includes an optional housing 130 (such as a housing made of metal or plastic) that at least partially encloses circuit board 110, baseplate 118 and thermal-coupling material 126. Moreover, module 100 may include optional thermal-coupling material 128 mechanically coupled to bottom surface 122. This optional thermal-coupling material may include a thermal pad, such as the Gap Pad VO Ultra Soft. Note that optional housing 130 may also partially enclose optional thermal-coupling material 128.

Figure 2:
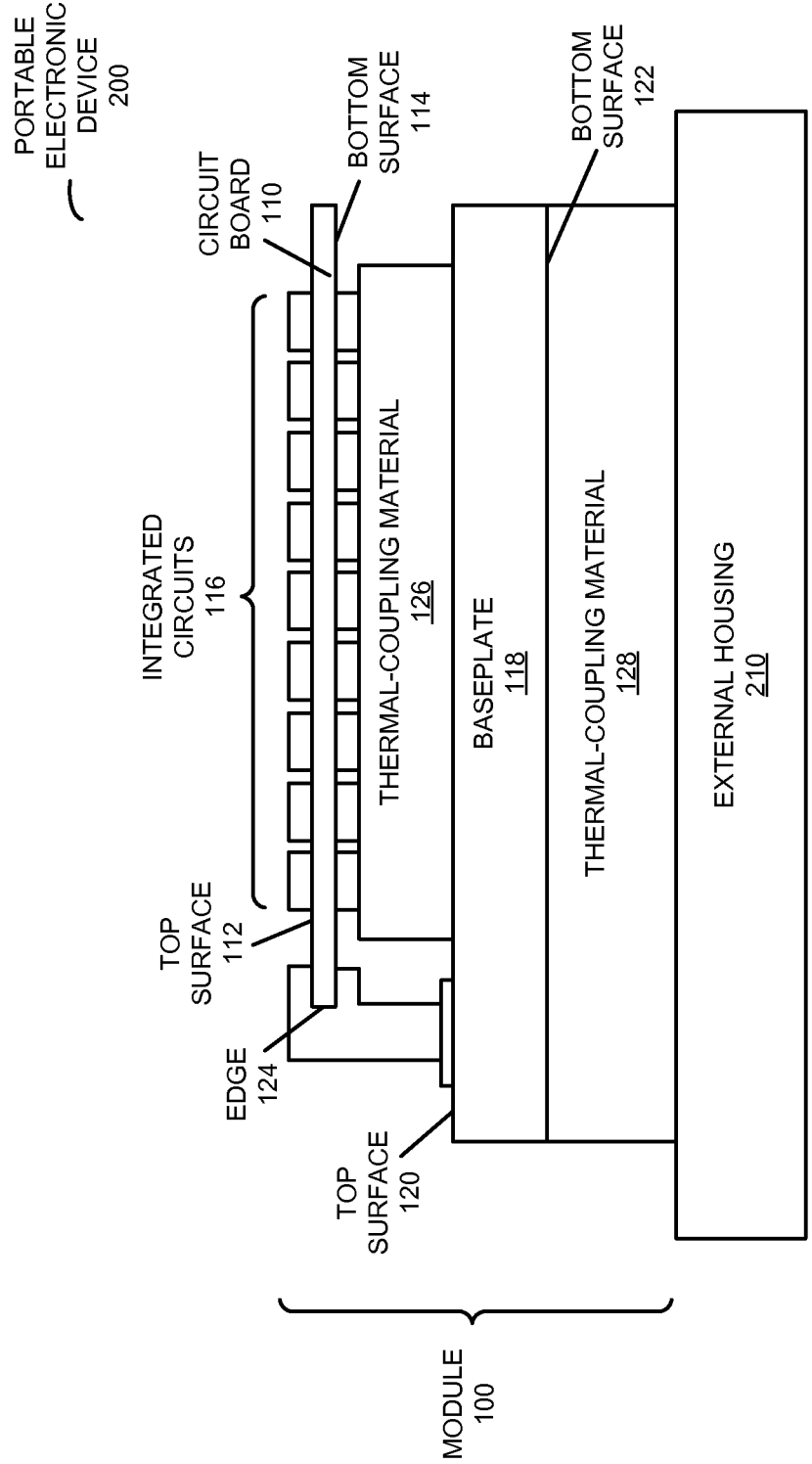
FIG. 2 is a block diagram illustrating a side view of the module of FIG. 1 in a portable electronic device in accordance with an embodiment of the present disclosure.

Module 100 may be included in an electronic device, such as a portable electronic device. This is shown in FIG. 2, which presents a block diagram illustrating a side view of module 100 (FIG. 1) in a portable electronic device 200. In particular, portable electronic device 200 may include an external housing 210 and module 100. In portable electronic device 200, thermal-coupling material 128 may be mechanically coupled to bottom surface 122 and external housing 210, and may increase a thermal conductance between baseplate 118 and external housing 210 so that external housing 210 can be used as a heat-transfer surface or heat spreader for integrated circuits 116. In addition, thermal-coupling material 128 may provide additional thermal inertia or thermal mass to circuit board 110 and integrated circuits 116. This thermal inertia may reduce temperature increases of circuit board 110 and integrated circuits 116 that occur during episodic operation of integrated circuits 116, such as during read or write operations.

By including thermal-coupling materials 126 and/or 128, hotspots in portable electronic device 200 that are associated with heat generated during operation of integrated circuits 116 may be reduced or eliminated. For example, during operation of portable electronic device 200, the maximum temperature associated with integrated circuits 116 may be less than 55 C.

Portable electronic device 200 may include: one or more program modules or sets of instructions stored in an optional memory subsystem, such as module 100. These sets of instructions may be executed by an optional processing subsystem (such as one or more processors) on a motherboard (not shown). Note that the one or more computer programs may constitute a computer-program mechanism. Moreover, instructions in the various modules in the optional memory subsystem may be implemented in: a high-level procedural language, an object-oriented programming language, and/or in an assembly or machine language. Furthermore, the programming language may be compiled or interpreted, e.g., configurable or configured, to be executed by the optional processing subsystem.

In some embodiments, functionality in these circuits, components and devices may be implemented in one or more: application-specific integrated circuits (ASICs), field-programmable gate arrays (FPGAs), and/or one or more digital signal processors (DSPs). Moreover, the circuits and components may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar.

Portable electronic device 200 may include one of a variety of devices that can include memory, including: a laptop computer, a media player (such as an MP3 player), an appliance, a subnotebook/netbook, a tablet computer, a smartphone, a cellular telephone, a network appliance, a personal digital assistant (PDA), a toy, a controller, a digital signal processor, a game console, a device controller, a computational engine within an appliance, a consumer-electronic device, a portable computing device, a personal organizer, and/or another electronic device.

While portable electronic device 200 was used as an illustration in the preceding discussion, in other embodiments module 100 is included in an electronic device, such as a server, a desktop computer, a mainframe computer and/or a blade computer. Moreover, alternative passive heat transfer components and/or materials may be used in thermal-coupling material 126 and/or 128. In some embodiments, circuit board 110 only includes integrated circuits 116 on top surface 112 and/or thermal-coupling mechanism 126 is pre-stressed with cavities corresponding to components on back surface 114 so that a contact area between thermal-coupling mechanism 126 and back surface 114 is maximized. Furthermore, in some embodiments there is a gap between optional thermal-coupling material 128 and external housing 210 in FIG. 2, so that heat is transferred to external housing 210 by radiation or conduction through air in the gap.

Additionally, one or more of the components may not be present in the FIGS. 1 and 2. In some embodiments, the preceding embodiments include one or more additional components that are not shown in FIGS. 1 and 2. Also, although separate components are shown in FIGS. 1 and 2, in some embodiments some or all of a given component can be integrated into one or more of the other components and/or positions of components can be changed.

Figure 3:
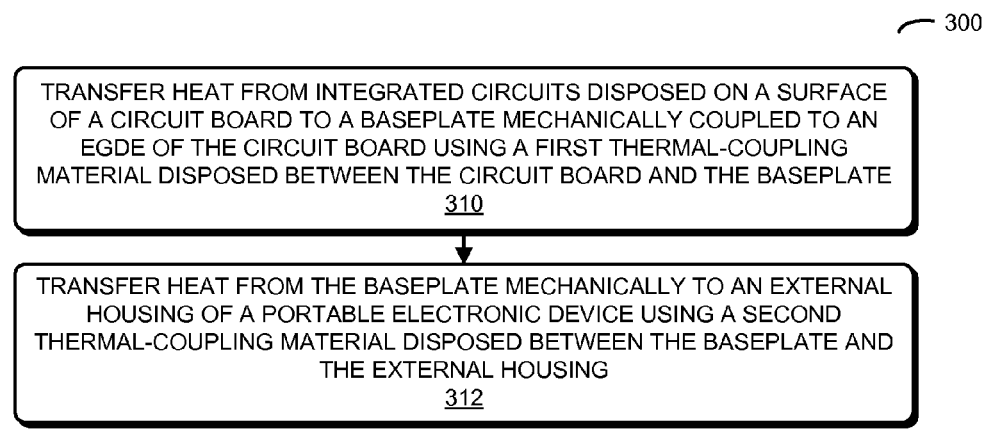
FIG. 3 is a flowchart illustrating a method for transferring heat from integrated circuits in accordance with an embodiment of the present disclosure.

We now describe embodiments of a method that can be performed using the preceding embodiments. FIG. 3 presents a flowchart illustrating a method 300 for transferring heat from integrated circuits, such as those in module 100 (FIG. 1). During the method, heat is transferred from the integrated circuits disposed on surfaces of a circuit board to a baseplate mechanically coupled to an edge of the circuit board using a first thermal-coupling material disposed between the circuit board and the baseplate (operation 310), where the first thermal-coupling material increases the thermal conductance between the circuit board and the baseplate. Then, heat is transferred from the baseplate to an external housing of a portable electronic device (which includes the circuit board, the integrated circuits and the baseplate) using a second thermal-coupling material disposed between the baseplate and the external housing (operation 312), where the second thermal-coupling material increases the thermal conductance between the baseplate and the external housing.

In some embodiments of method 300, there may be additional or fewer operations. Moreover, the order of the operations may be changed, and/or two or more operations may be combined into a single operation.

Figure 4:
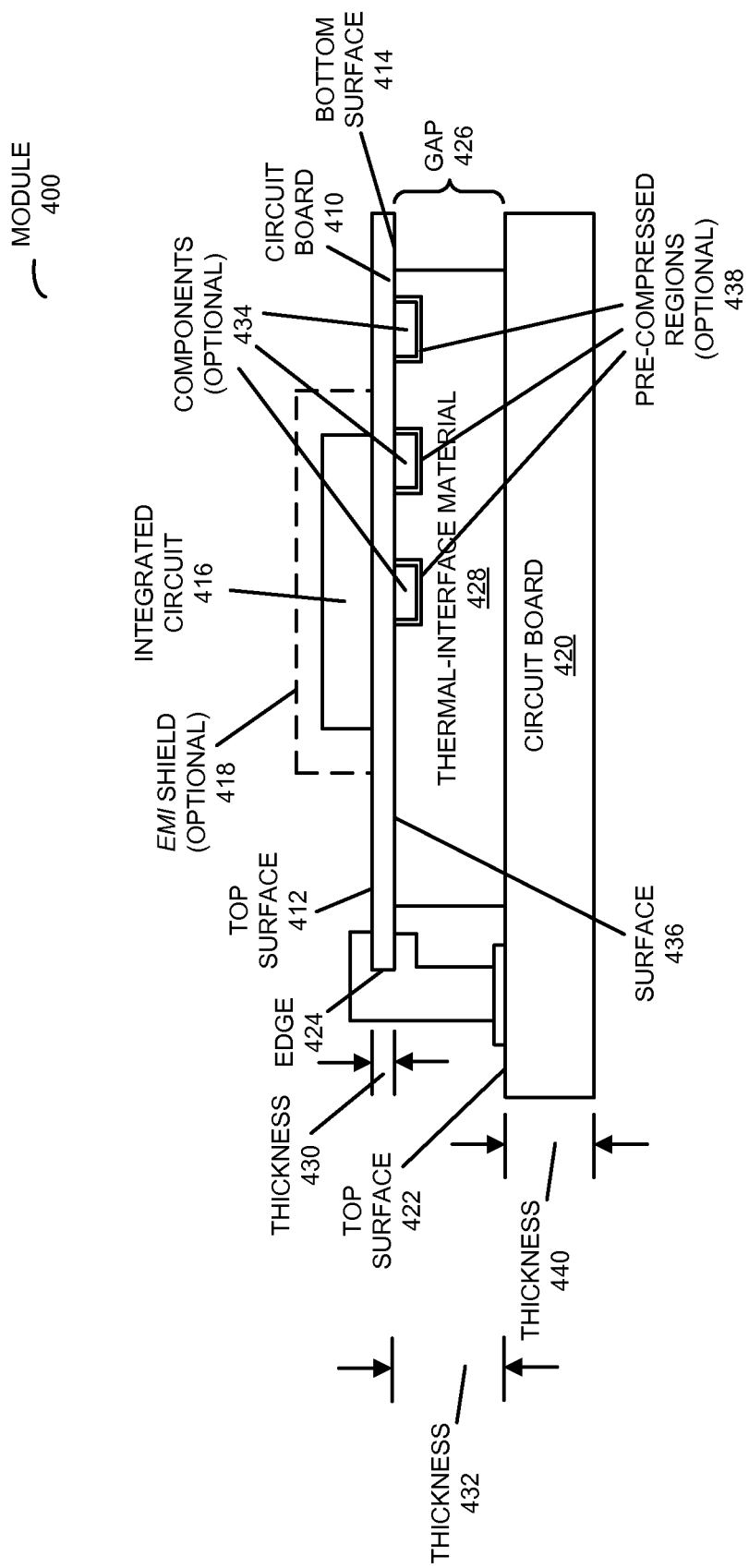
FIG. 4 is a block diagram illustrating a side view of a module in accordance with an embodiment of the present disclosure.

We now describe embodiments of thermal-management technique for a wireless-communication integrated circuit. FIG. 4 presents a block diagram illustrating a side view of a module 400. This module includes a circuit board 410, having a top surface 412 and a bottom surface 414, and at least an integrated circuit 416 disposed on top surface 412. For example, integrated circuit 416 may include a wireless-communication integrated circuit, and circuit board 410 may include a wireless-communication circuit board. Therefore, in some embodiments integrated circuit 416 may be at least partially enclosed by an optional electromagnetic-interference (EMI) shield 418. Alternatively, integrated circuit 416 may include a solid-state memory, such as flash memory, dynamic-random-access memory (DRAM) or, more generally, another type of volatile or non-volatile computer-readable memory. Thus, circuit board 410 may include a solid-state drive.

Moreover, module 400 includes a circuit board 420, having a top surface 422, mechanically coupled to an edge 424 of circuit board 410. Bottom surface 414 of circuit board 410 may be separated from top surface 422 of circuit board 420 by a gap 426, and a thermal-interface material 428 in gap 426 may thermally couple circuit board 410 and circuit board 420 so that heat generated during operation of integrated circuit 416 is conducted to circuit board 420. The ground plane(s) and copper traces in circuit board 420 can then function as a heat sink for circuit board 110 and integrated circuit 116. In addition, thermal-interface material 428 may provide additional thermal inertia or thermal mass to circuit board 410 and integrated circuit 416. This thermal inertia may reduce temperature increases of circuit board 410 and integrated circuit 416 that occur during episodic operation of integrated circuit 416, such as during read or write operations.

In particular, thermal-interface material 428 may increase a thermal conductance (defined as $\kappa \cdot A/L$, where $\kappa$ is the thermal conductivity of thermal-interface material 428, A is a cross-sectional area, and L is a thickness) between circuit board 410 and circuit board 420 so that circuit board 420 can be used as a heat-transfer surface or heat spreader for integrated circuit 416. For example, thermal-interface material 428 may include: a foam, a thermal gel, a thermal pad, thermal grease, and/or an elastomeric material. In an exemplary embodiment, the thermal gel is Gel 30 (from Chomerics North America of Woburn, Mass.) and/or the thermal pad is the Gap Pad VO Ultra Soft (from The Bergquist Company of Chanhassen, Minn.).

In an exemplary embodiment, circuit board 410 has a thickness 430 of 0.8 mm, gap 426 has a thickness 432 of 1.6 mm, and circuit board 420 has a thickness 440 of 1.0 mm. Moreover, during operation, integrated circuit 416 may have a power consumption of approximately 3.5 W.

In some embodiments, module 400 includes optional components 434 (such as capacitors) disposed on bottom surface 414 of circuit board 410, where a surface 436 of thermal-interface material 428 facing bottom surface 414 includes optional pre-compressed regions 438 so that a contact area between surface 436 and bottom surface 414 is increased relative to a thermal-interface material without optional pre-compressed regions 438. In addition, optional pre-compressed regions 438 may ensure that the stress applied to optional components 434 by thermal-interface material 428 does not exceed a strain limit of circuit board 410, so that optional components 434 do not detach from bottom surface 414.

Figure 5:
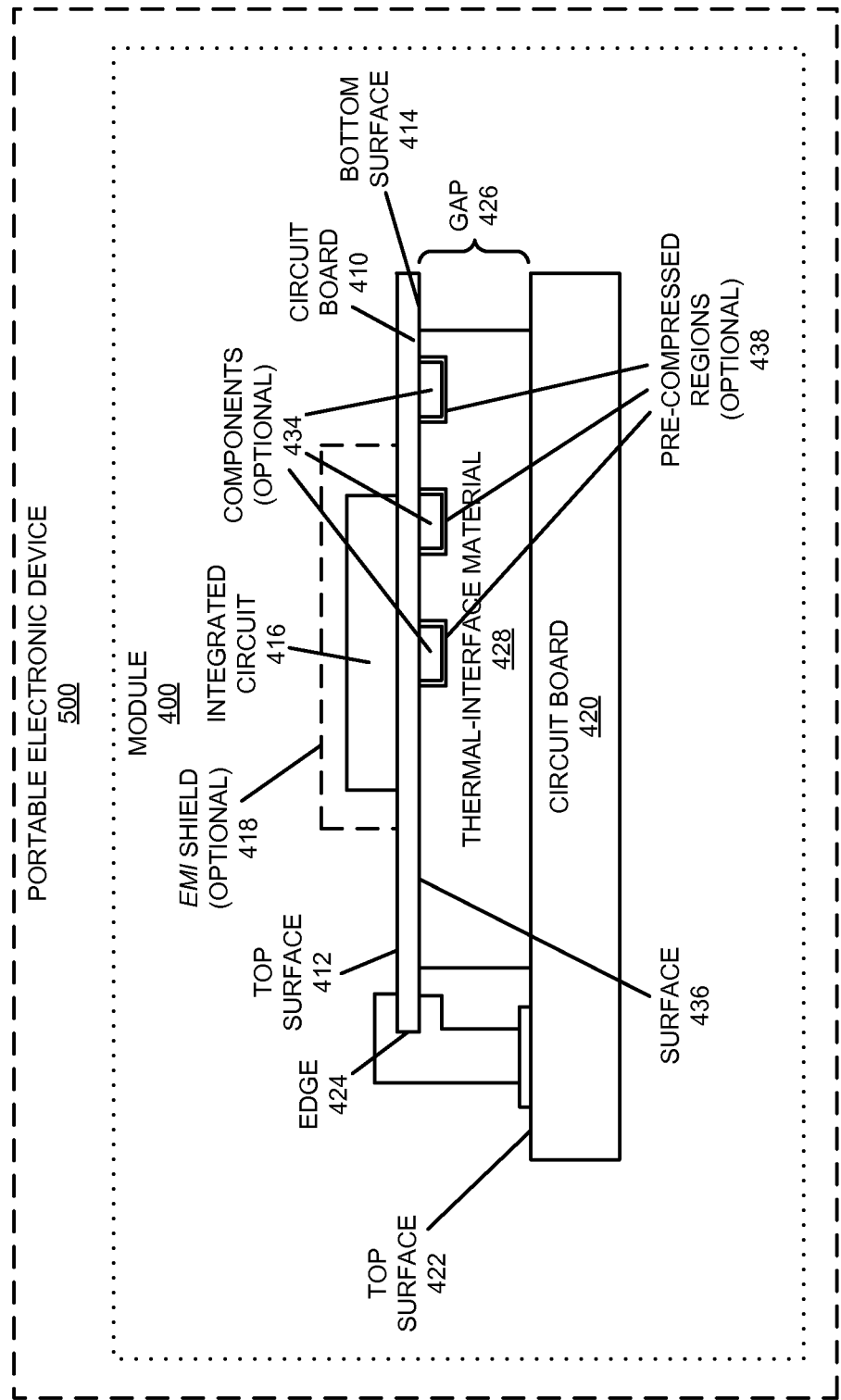
FIG. 5 is a block diagram illustrating a side view of the module of FIG. 1 in a portable electronic device in accordance with an embodiment of the present disclosure.

Module 400 may be included in an electronic device, such as a portable electronic device. This is shown in FIG. 5, which presents a block diagram illustrating a side view of module 400 (FIG. 4) in a portable electronic device 500.

By including thermal-interface material 428, hotspots in portable electronic device 500 that are associated with heat generated during operation of integrated circuit 416 may be reduced or eliminated. For example, during operation of portable electronic device 500, the maximum temperature associated with integrated circuit 416 may be less than 55 C.

Portable electronic device 500 may include: one or more program modules or sets of instructions stored in an optional memory subsystem, such as module 500. These sets of instructions may be executed by an optional processing subsystem (such as one or more processors) on a motherboard, such as circuit board 420. Note that the one or more computer programs may constitute a computer-program mechanism. Moreover, instructions in the various modules in the optional memory subsystem may be implemented in: a high-level procedural language, an object-oriented programming language, and/or in an assembly or machine language. Furthermore, the programming language may be compiled or interpreted, e.g., configurable or configured, to be executed by the optional processing subsystem.

In some embodiments, functionality in these circuits, components and devices may be implemented in one or more: application-specific integrated circuits (ASICs), field-programmable gate arrays (FPGAs), and/or one or more digital signal processors (DSPs). Moreover, the circuits and components may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar.

Portable electronic device 500 may include one of a variety of devices that can include memory, including: a laptop computer, a media player (such as an MP3 player), an appliance, a subnotebook/netbook, a tablet computer, a smartphone, a cellular telephone, a network appliance, a personal digital assistant (PDA), a toy, a controller, a digital signal processor, a game console, a device controller, a computational engine within an appliance, a consumer-electronic device, a portable computing device, a personal organizer, and/or another electronic device.

While portable electronic device 500 was used as an illustration in the preceding discussion, in other embodiments module 400 is included in an electronic device, such as a server, a desktop computer, a mainframe computer and/or a blade computer. Furthermore, alternative passive heat transfer components and/or materials may be used in thermal-interface material 528.

Additionally, one or more of the components may not be present in FIGS. 4 and 5. In some embodiments, the preceding embodiments include one or more additional components that are not shown in FIGS. 4 and 5. Also, although separate components are shown in FIGS. 4 and 5, in some embodiments some or all of a given component can be integrated into one or more of the other components and/or positions of components can be changed.

Figure 6:
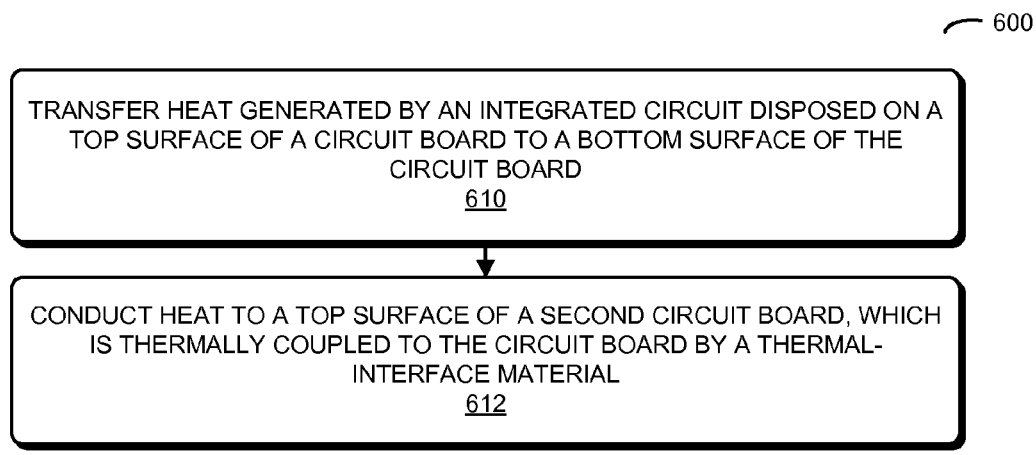
FIG. 6 is a flowchart illustrating a method for transferring heat from an integrated circuit in accordance with an embodiment of the present disclosure.

We now describe embodiments of a method that can be performed using the embodiments in FIGS. 4 and 5. FIG. 6 presents a flowchart illustrating a method 600 for transferring heat from an integrated circuit, such as that in module 400 (FIG. 4). During the method, heat generated by the integrated circuit disposed on the top surface of the circuit board is transferred to the bottom surface of the circuit board (operation 410). Then, the heat is conducted to a top surface of the second circuit board, which is thermally coupled to the circuit board by the thermal-interface material (operation 412). Note that the bottom surface of the circuit board is separated from the top surface of the second circuit board by the gap, and the thermal-interface material is in the gap between the bottom surface of the circuit board and the top surface of the second circuit board.

In some embodiments of method 600, there may be additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A module, comprising: a housing; a circuit board having an integrated circuit disposed on a surface of the circuit board; a baseplate mechanically coupled to an edge of the circuit board; a thermal-coupling material that: is positioned between and contacts the integrated circuit, and the baseplate, and directly contacts the circuit board, wherein the thermal-coupling material provides for thermal conductance between the circuit board and the baseplate; and a secondary thermal-coupling material disposed between and directly contacting the housing and the baseplate.

2. The module of claim 1, wherein the thermal-coupling material directly contacts the integrated circuit and the baseplate.

3. The module of claim 1, wherein at least a portion of the thermal-coupling material at least partially envelopes the integrated circuit.

4. The module of claim 1, wherein the thermal-coupling material includes one of a thermal pad and a thermal gel.

5. The module of claim 1, further comprising an arm that extends from the baseplate and grasps the edge of the circuit board, wherein the arm is secured to at least two surfaces of the circuit board.

6. The module of claim 1, wherein the secondary thermal-coupling material includes one of a thermal pad and a thermal gel.

7. The module of claim 6, wherein the secondary thermal-coupling material directs heat from the baseplate to the housing.

8. The module of claim 1, wherein the integrated circuit includes an electromagnetic interference shield.

9. The module of claim 1, wherein the circuit board includes integrated circuits disposed on opposing surfaces of the circuit board.

10. A portable electronic device, comprising: a housing; a circuit board having an integrated circuit disposed on a surface of the circuit board; a baseplate mechanically coupled to an edge of the circuit board; a thermal-coupling material that is positioned between and contacts the integrated circuit and the baseplate, and directly contacts the circuit board, wherein the thermal-coupling material provides for thermal conductance between the circuit board and the baseplate; and a secondary thermal-coupling material disposed between and directly contacting the housing and the baseplate.

11. The portable electronic device of claim 10, wherein the thermal-coupling material directly contacts the integrated circuit, the circuit board, and the baseplate.

12. The portable electronic device of claim 10, wherein at least a portion of the thermal-coupling material at least partially envelopes the integrated circuit.

13. The portable electronic device of claim 10, wherein the thermal-coupling material includes one of a thermal pad and a thermal gel.

14. The portable electronic device of claim 10, further comprising an arm that extends from the baseplate and grasps an edge of the circuit board, wherein the arm is secured to at least two surfaces of the circuit board.

15. The portable electronic device of claim 10, wherein the integrated circuit includes an electromagnetic interference shield.

16. The portable electronic device of claim 15, wherein the circuit board includes integrated circuits disposed on opposing surfaces of the circuit board.

17. A method for transferring heat from an integrated circuit of a circuit board, the method comprising: transferring heat from the integrated circuit to a baseplate using a first thermal-coupling material that is positioned between and contacts the integrated circuit and the baseplate, and directly contacts the circuit board; and transferring heat from the baseplate to an external housing of a portable electronic device using a second thermal-coupling material disposed between and directly contacting the baseplate and the external housing.

18. The method of claim 17, wherein the thermal-coupling material directly contacts a surface of the circuit board and the baseplate.

19. The method of claim 17, wherein at least a portion of the thermal-coupling material at least partially envelopes the integrated circuit gel.

20. The method of claim 17, wherein the baseplate includes an arm that extends from the baseplate and grasps an edge of the circuit board, wherein the arm is secured to at least two surfaces of the circuit board.

21. A module, comprising: a housing; a first circuit board having an integrated circuit disposed on a surface of the first circuit board; a second circuit board that is mechanically coupled to the first circuit board, wherein the surface of the first circuit board is separated from the second circuit board; a thermal-coupling material that is positioned between and contacts the integrated circuit and the second circuit board, and directly contacts the first circuit board; and a secondary thermal-coupling material disposed between and directly contacting a housing surface and the second circuit board.

22. The module of claim 21, wherein the thermal-coupling material directly contacts the surface of the first circuit board, the integrated circuit, and the second circuit board.

23. The module of claim 22, wherein at least a portion of the thermal-coupling material at least partially envelopes the integrated circuit.

24. The module of claim 21, wherein the integrated circuit includes a solid-state memory.

25. The module of claim 21, further comprising:
an arm that extends from the second circuit board and grasps an edge of the first circuit board, wherein the arm is secured to at least two surfaces of the first circuit board.

26. The module of claim 21, wherein the thermal-coupling material includes one of: a foam, a thermal gel, a thermal pad, thermal grease, and an elastomeric material.

27. The module of claim 21, wherein the integrated circuit includes an electromagnetic interference shield.

28. A portable electronic device, comprising:
a first circuit board having a component disposed on a surface of the first circuit board;
a second circuit board that is mechanically coupled to the first circuit board, wherein the component is separated from the second circuit board by a gap; and
a thermal-interface material in the gap between the component and the second circuit board, wherein a portion of the thermal-interface material facing the surface of the first circuit board includes a pre-compressed region that (i) is compressed partially into the gap away from the surface and (ii) at least partially envelopes the component on the surface of the first circuit board.

29. The portable electronic device of claim 28, further comprising an electromagnetic-interference shield at least partially enclosing the component.

30. The portable electronic device of claim 29, wherein the first circuit board includes a wireless-communication circuit board.

31. The portable electronic device of claim 28, wherein the component includes a solid-state memory.

32. The portable electronic device of claim 31, wherein the first circuit board includes a solid-state drive.

33. The portable electronic device of claim 28, wherein the thermal-interface material includes one of: a foam, a thermal gel, a thermal pad, a thermal grease, and an elastomeric material.

34. The portable electronic device of claim 28, wherein the portion of the thermal-interface material is disposed between the component and the second circuit board.

35. A method for transferring heat away from an integrated circuit, the method comprising: transferring heat away from the integrated circuit, which is disposed on a surface of a first circuit board; directing the heat to a second circuit board, which is thermally coupled to the first circuit board by a thermal-coupling material, wherein the thermal-coupling material is positioned between and contacts the integrated circuit and the second circuit board, and directly contacts the first circuit board; and transferring heat from the second circuit board to an external housing of a portable electronic device using a secondary thermal-coupling material disposed between and directly contacting the second circuit board and the external housing.

36. The method of claim 35, wherein the thermal-coupling material directly contacts the surface of first circuit board, the integrated circuit, and the second circuit board.

37. The method of claim 35, wherein at least a portion of the thermal-coupling material at least partially envelopes the integrated circuit.

38. The method of claim 35, wherein the second circuit board includes an arm that extends from the second circuit board, grasps an edge of the first circuit board, and is secured to at least two surfaces of the first circuit board.

39. The method of claim 38, wherein the integrated circuit includes an electromagnetic interference (EMI) shield, and the heat is emitted at least partially by the EMI shield.

40. The method of claim 35, wherein the thermal-coupling material includes one of: a foam, a thermal gel, a thermal pad, a thermal grease, and an elastomeric material.

* * * * *